US010326192B2

(12) United States Patent
Lin et al.

(10) Patent No.: US 10,326,192 B2
(45) Date of Patent: Jun. 18, 2019

(54) ACOUSTIC-WAVE DEVICE WITH ACTIVE CALIBRATION MECHANISM

(71) Applicant: Airoha Technology Corp., Hsinchu (TW)

(72) Inventors: Heng-Chih Lin, Hsinchu (TW); Chin-Lung Yang, Taoyuan (TW)

(73) Assignee: AIROHA TECHNOLOGY CORP., Hsinchu (TW)

( * ) Notice: Subject to any disclaimer, the term of this patent is extended or adjusted under 35 U.S.C. 154(b) by 0 days.

(21) Appl. No.: 15/456,665

(22) Filed: Mar. 13, 2017

(65) Prior Publication Data

US 2017/0272056 A1 Sep. 21, 2017

(30) Foreign Application Priority Data

Mar. 15, 2016 (TW) .............................. 105107942 A
Mar. 15, 2016 (TW) .............................. 105107944 A

(51) Int. Cl.
*H04B 1/44* (2006.01)
*H03D 1/22* (2006.01)
(Continued)

(52) U.S. Cl.
CPC ............ *H01P 7/088* (2013.01); *H03B 5/326* (2013.01); *H03H 9/64* (2013.01); *H03H 9/6403* (2013.01);
(Continued)

(58) Field of Classification Search
CPC ................. H04B 1/40; H04B 1/50; H03L 7/16
(Continued)

(56) References Cited

U.S. PATENT DOCUMENTS 4,862,110 A 8/1989 Charbonnier
7,187,945 B2 * 3/2007 Ranta ...................... H03J 5/244
455/552.1

(Continued)

FOREIGN PATENT DOCUMENTS

TW 200926630 A 6/2009

OTHER PUBLICATIONS

Notice of Allowance issued in U.S. Appl. No. 15/456,680, filed Mar. 13, 2017, dated May 23, 2018.
(Continued)

*Primary Examiner* — Dean O Takaoka
(74) *Attorney, Agent, or Firm* — McClure, Qualey & Rodack, LLP

(57) ABSTRACT

An acoustic-wave device with active calibration mechanism is provided. The acoustic-wave device with active calibration mechanism includes at least one acoustic-wave duplexer, a voltage-controlled oscillator (VCO), a frequency discriminator and a control circuit. The acoustic-wave duplexer includes a TX filter and an RX filter. The voltage-controlled oscillator includes a calibration resonator and a tunable negative impedance circuit. The TX filter, the RX filter and the calibration resonator are disposed on the same piezoelectric substrate. The frequency discriminator generates a calibration signal according to a frequency deviation of the calibration resonator. The control circuit is connected to the acoustic-wave duplexer and the frequency discriminator. The control circuit adjusts an operating frequency of the TX filter or an operating frequency of the RX filter according to the calibration signal.

15 Claims, 8 Drawing Sheets

(51) Int. Cl.

| | | |
|---|---|---|
| *G01S 19/23* | (2010.01) | |
| *H01P 7/08* | (2006.01) | |
| *H03H 9/72* | (2006.01) | |
| *H03B 5/32* | (2006.01) | |
| *H03H 9/64* | (2006.01) | |
| *H03L 7/093* | (2006.01) | |
| *H03L 7/099* | (2006.01) | |
| *H03J 3/00* | (2006.01) | |

(52) U.S. Cl.
CPC .......... *H03H 9/6483* (2013.01); *H03H 9/725* (2013.01); *H03J 3/00* (2013.01); *H03L 7/093* (2013.01); *H03L 7/099* (2013.01); *H03H 2210/012* (2013.01); *H03H 2210/04* (2013.01)

(58) Field of Classification Search
USPC ................................ 455/77, 78, 85, 255, 260
See application file for complete search history.

(56) References Cited

U.S. PATENT DOCUMENTS

| | | | |
|---|---|---|---|
| 7,221,920 B2 * | 5/2007 | Abe ........................ | H03B 5/326 331/108 B |
| 7,453,335 B2 | 11/2008 | Funami et al. | |
| 8,011,074 B2 | 9/2011 | Bhattacharjee et al. | |
| 8,346,180 B2 * | 1/2013 | Kamizuma .......... | H04B 1/0082 455/73 |
| 10,033,085 B2 * | 7/2018 | Lin ......................... | H01P 7/088 |
| 2010/0212127 A1 * | 8/2010 | Heinze .................... | H03H 3/04 29/25.35 |
| 2011/0018649 A1 * | 1/2011 | David .................... | H03B 5/326 331/158 |
| 2013/0039228 A1 | 2/2013 | Caron | |
| 2013/0234806 A1 | 9/2013 | Schmidhammer et al. | |
| 2013/0241670 A1 * | 9/2013 | Mikhemar .............. | H04B 1/52 333/126 |
| 2014/0220921 A1 | 8/2014 | Mo et al. | |
| 2015/0341016 A1 * | 11/2015 | Iwaki .................... | H03H 9/205 333/133 |
| 2017/0271743 A1 * | 9/2017 | Lin ......................... | H01P 7/088 |
| 2017/0272056 A1 | 9/2017 | Lin et al. | |

OTHER PUBLICATIONS

TIPO Office Action dated Mar. 28, 2018 in corresponding Taiwan application (No. 105107942).

* cited by examiner

ACOUSTIC-WAVE DEVICE WITH ACTIVE CALIBRATION MECHANISM

This application claims the benefits of Taiwan application Serial No. 105107942, filed Mar. 15, 2016 and Taiwan application Serial No. 105107944, filed Mar. 15, 2016, the subject matters of which are incorporated herein by reference.

BACKGROUND OF THE INVENTION

Field of the Invention

The invention relates in general to an acoustic-wave device, and more particularly to an acoustic-wave device with active calibration mechanism.

Description of the Related Art

Referring to FIG. 1, a schematic diagram of an acoustic-wave device 900 is shown. The acoustic-wave device 900 includes a piezoelectric substrate 910, a piezo film layer 920 and an interdigitated capacitor structure 930. Surface acoustic waves are spread on the interdigitated capacitor structure 930. An electric signal is converted into an acoustic signal by the piezo film layer 920, and then the acoustic signal is further converted into an electric signal.

Along with the development of the technique of surface acoustic wave, the acoustic-wave device 900 has been used in many fields. For example, the acoustic-wave device 900 can be used as a filter, an oscillator, a transformer and a sensor of a mobile phone. The acoustic-wave device 900 can also be used in the fields of radio and TV, such that the frequency range of radio reception can be very narrow and accurate. Or, the acoustic-wave device 900 can monitor and forecast earthquakes because the surface acoustic wave can be spread on the surface of the earth.

Since the interdigitated capacitor structure 930 and the piezo film layer 920 have different coefficients of thermal expansion, the acoustic-wave device 900 may generate warpage. Referring to FIG. 2A, a schematic diagram of the acoustic-wave device 900 at a low temperature state is shown. When the acoustic-wave device 900 at the low temperature state, the contraction of the interdigitated capacitor structure 930 is greater than that of the piezo film layer 920, so the two edges of the acoustic-wave device 900 will be warped upward. At the low temperature state, the pitch of the interdigitated capacitor structure 930 is reduced, the signals are shifted towards high frequencies.

Referring to FIG. 2B, a schematic diagram of the acoustic-wave device 900 at a high temperature state is shown. When the acoustic-wave device 900 at the high temperature state, the expansion of the interdigitated capacitor structure 930 is greater than that of the piezo film layer 920, so the two edges of the acoustic-wave device 900 will be warped downward. At the high temperature state, the pitch of the interdigitated capacitor structure 930 is enlarged, the signals are shifted towards low frequencies.

Referring to FIG. 3A, an insertion loss curve diagram of the acoustic-wave device 900 under different temperatures is shown. The frequency response curve L11 is an insertion loss curve measured at 20° C. the frequency response curve L12 is an insertion loss curve measured at 50° C., and the frequency response curve L13 is an insertion loss curve measured at 85° C. The three frequency response curves L11, L12 and L13 show that as the temperature increases, the insertion loss gradually drifts towards low frequencies.

Referring to FIG. 3B, a return loss curve diagram of the acoustic-wave device 900 under different temperatures. The frequency response curve L21 is a return loss curve measured at 20° C., the frequency response curve L22 is a return loss curve measured at 50° C., and the frequency response curve L23 is a return loss curve measured at 85° C. The three frequency response curves L21, L22 and L23 show that as the temperature increases, the return loss gradually drifts towards low frequencies.

Apart from the temperature which may cause signal variation to the acoustic-wave device 900, errors in the manufacturing process also cause signal variation to the acoustic-wave device 900. For example, when the pitch of the interdigitated capacitor structure 930 is too small, signals will shift towards high frequencies. On the other hand, when the pitch of the interdigitated capacitor structure 930 is too large, signals will shift towards low frequencies.

As disclosed above, signal variation caused by temperature factor or manufacturing process factor has always been a bottleneck that is hard to overcome. The research personnel in the industries have been dedicated to resolve the bottleneck.

SUMMARY OF THE INVENTION

The invention is directed to an acoustic-wave device with active calibration mechanism. A calibration resonator is used to understand a signal variation caused from temperature factor or manufacturing process factor, such that the acoustic-wave device can be actively calibrated.

According to an embodiment of the present invention, an acoustic-wave device with active calibration mechanism is provided. The acoustic-wave device with active calibration mechanism includes at least one acoustic-wave duplexer, a voltage-controlled oscillator (VCO), a frequency discriminator and a control circuit. The acoustic-wave duplexer includes a TX filter and an RX filter. The voltage-controlled oscillator includes a calibration resonator and a tunable negative impedance circuit. The TX filter, the RX filter and the calibration resonator are disposed on the same piezoelectric substrate. The frequency discriminator generates a calibration signal according to a frequency deviation of the calibration resonator. The control circuit is connected to the acoustic-wave duplexer and the frequency discriminator. The control circuit adjusts an operating frequency of the TX filter or an operating frequency of the RX filter according to the calibration signal.

According to another embodiment of the present invention, an acoustic-wave device with active calibration mechanism is provided. The acoustic-wave device with active calibration mechanism includes at least one acoustic-wave duplexer, a phase-locked loop (PLL) and a control circuit. The acoustic-wave duplexer includes a TX filter and an RX filter. The phase-locked loop at least includes a voltage-controlled oscillator (VCO). The voltage-controlled oscillator includes a calibration resonator and a tunable negative impedance circuit. The TX filter, the RX filter and the calibration resonator are disposed on the same piezoelectric substrate. The phase-locked loop generates a calibration signal according to a frequency deviation of the calibration resonator. The control circuit is connected to the acoustic-wave duplexer and the phase-locked loop. The control circuit adjusts an operating frequency of the TX filter or an operating frequency of the RX filter according to the calibration signal.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
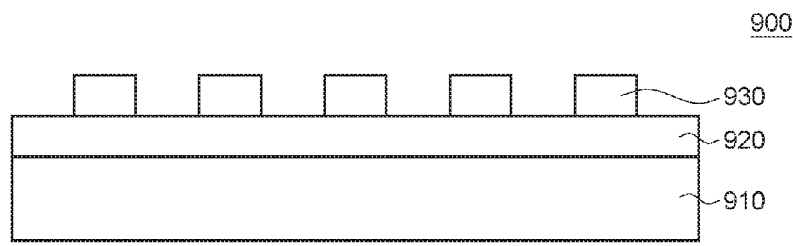
FIG. 1 (prior art) shows a schematic diagram of an acoustic-wave device.
Figure 2A:
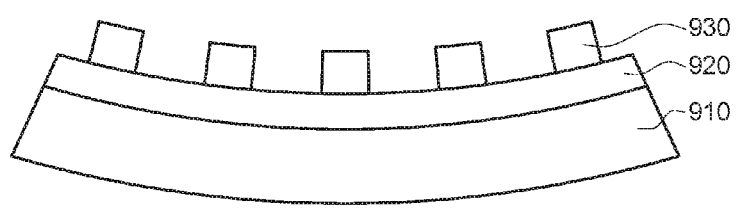
FIG. 2A (prior art) shows a schematic diagram of the acoustic-wave device at a low temperature state.
Figure 2B:
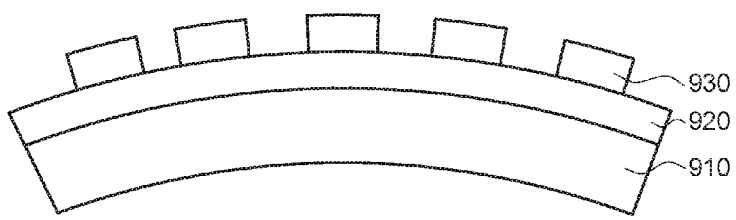
FIG. 2B (prior art) shows a schematic diagram of the acoustic-wave device at a high temperature state.
Figure 3A:
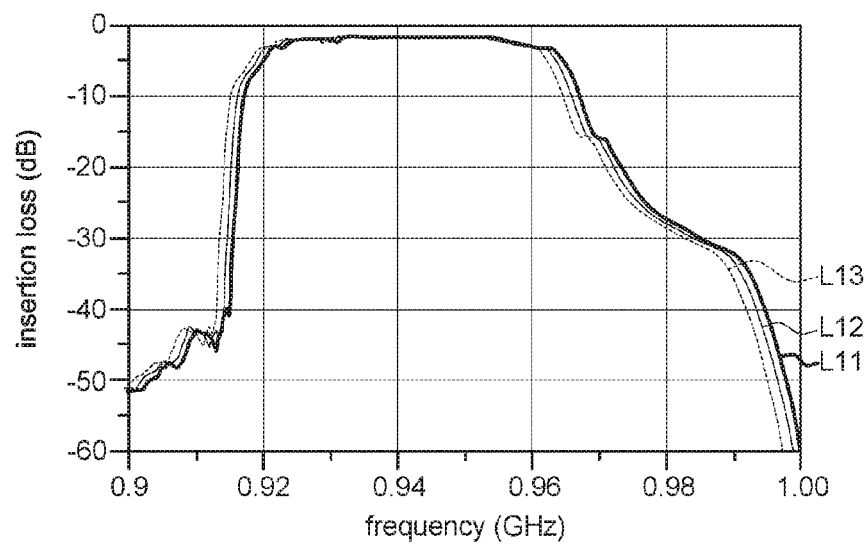
FIG. 3A (prior art) shows an insertion loss curve diagram of the acoustic-wave device under different temperatures.
Figure 3B:
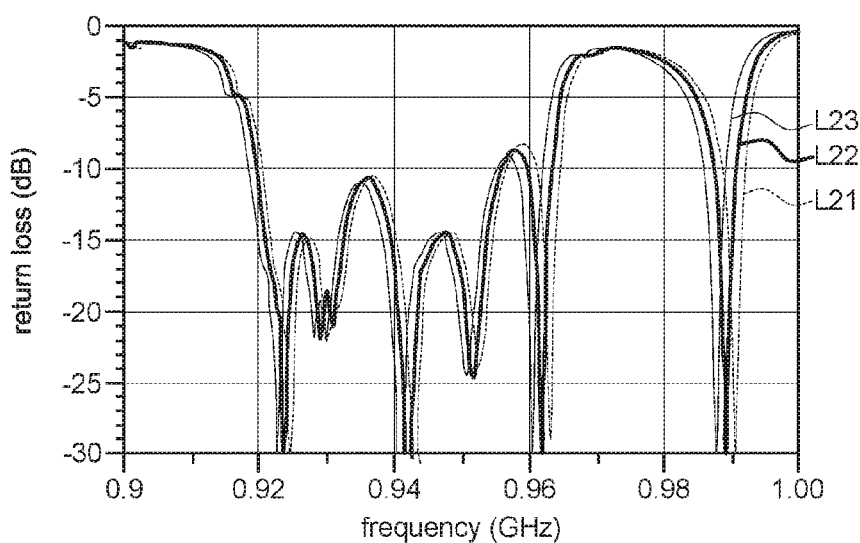
FIG. 3B (prior art) shows a return loss curve diagram of the acoustic-wave device under different temperatures.
Figure 4:
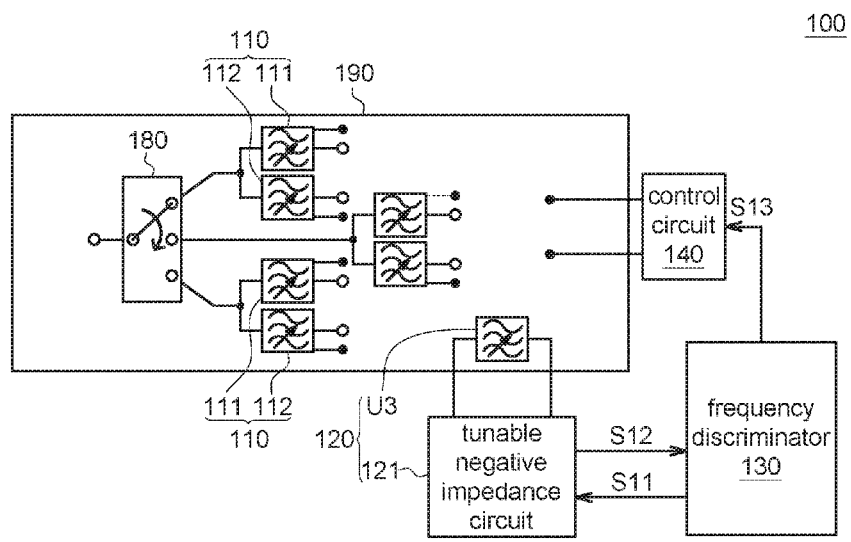
FIG. 4 (prior art) shows a schematic diagram of an acoustic-wave device with active calibration mechanism according to an embodiment of the invention.

Referring to FIG. 4, a schematic diagram of an acoustic-wave device 100 with active calibration mechanism according to an embodiment of the invention is shown. The acoustic-wave device 100 includes at least one acoustic-wave duplexer 110, a voltage-controlled oscillator (VCO) 120, a frequency discriminator 130 and a control circuit 140. The acoustic-wave duplexer 110 includes a TX filter 111 and an RX filter 112. The TX filter 111 is used for transmitting signals. The RX filter 112 is used for receiving signals. In one embodiment, the acoustic-wave device 100 may include multiple acoustic-wave duplexers 110 for processing the signals of different frequency bands. The multiple acoustic-wave duplexers 110 can be switched using a switch 180.

Figure 5:
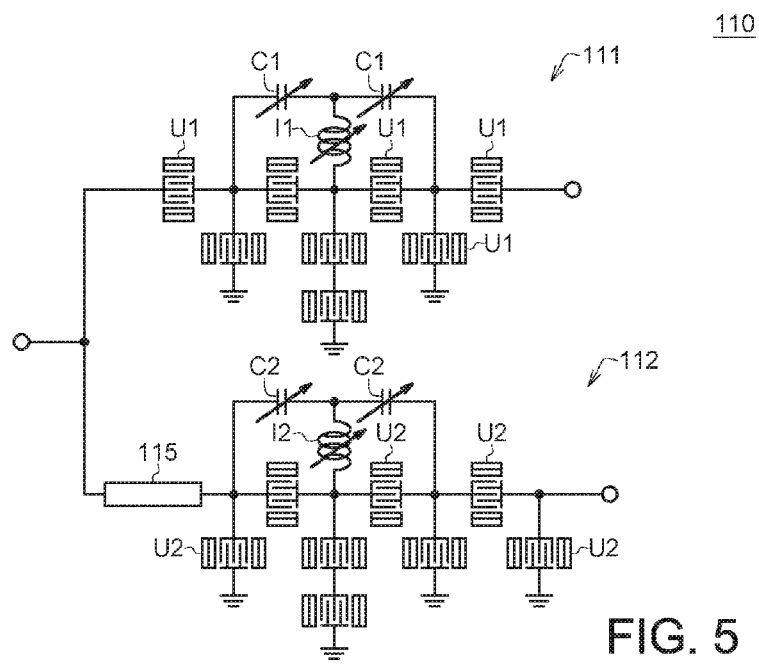
FIG. 5 shows a schematic diagram of an acoustic-wave duplexer.

Referring to FIG. 5, a schematic diagram of the acoustic-wave duplexer 110 is shown. The RX filter 112 is connected to a phase shifter 115. The TX filter 111 includes a plurality of transmitting resonators U1, two variable capacitors C1 and a variable inductor I1. The RX filter 112 includes a plurality of receiving resonators U2, two variable capacitors C2 and a variable inductor I2. Each of the transmitting resonator U1 and the receiving resonator U2 is an interdigitated structure whose pitch may be easily changed due to temperature factor or manufacturing process factor.

Figure 6A:
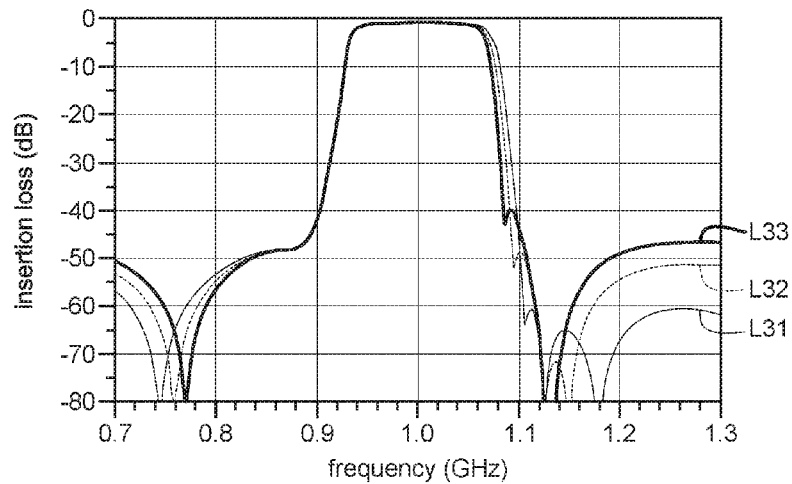
FIG. 6A shows an insertion loss curve diagram of a variable capacitor set at different capacitances.

Referring to FIG. 6A, an insertion loss curve diagram of the variable capacitor C1 set at different capacitances is shown. Let the TX filter 111 be taken for example. Given that the variable inductor I1 is fixed at 1.5 nH, the frequency response curve L31 is an insertion loss curve obtained when the variable capacitor C1 is set as 0.25 pF; the frequency response curve L32 is an insertion loss curve obtained when the variable capacitor C1 is set as 0.40 pF; the frequency response curve L33 is an insertion loss curve obtained when the variable capacitor C1 is set as 0.55 pF. The three frequency response curves L31, L32 and L33 show that the operating frequency of the TX filter 111 can be changed through the control of the variable capacitor C1. Similarly, the operating frequency of the RX filter 112 can also be changed through the control of the variable capacitor C2. Thus, as indicated in FIG. 4, the control circuit 140 can control the variable capacitor C1 or the variable capacitor C2 to adjust the operating frequency of the TX filter 111 or the operating frequency of the RX filter 112.

Figure 6B:
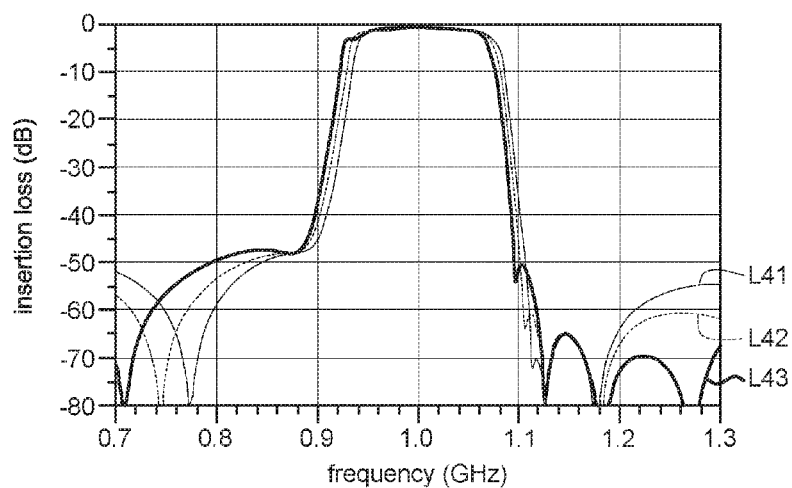
FIG. 6B shows an insertion loss curve diagram of a variable inductor set at different inductances.

Referring to FIG. 6B, an insertion loss curve diagram of the variable inductor I1 set at different inductances is shown. Let the TX filter 111 be taken for example. Given that the variable capacitor C1 is fixed at 0.25 pF, the frequency response curve L41 is an insertion loss curve obtained when the variable inductor I1 is set as 0.5 nH; the frequency response curve L42 is an insertion loss curve obtained when the variable inductor I1 is set as 1.5 nH; the frequency response curve L43 is an insertion loss curve obtained when the variable inductor I1 is set as 2.5 nH. The three frequency response curves L41, L42, and L43 show that the operating frequency of the TX filter 111 can be changed through the control of the variable inductor I1. Similarly, the operating frequency of the RX filter 112 can also be changed through the control of the variable inductor I2. Thus, as indicated in FIG. 4, the control circuit 140 can control the variable inductor I1 or the variable inductor I2 to adjust the operating frequency of the TX filter 111 or the operating frequency of the RX filter 112.

Figure 7A:
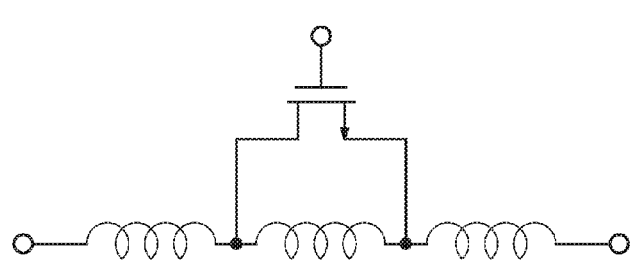
FIGS. 7A to 7C show schematic diagrams of different designs of variable inductors.
Figure 7B:
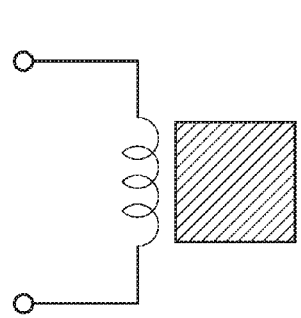
Figure 7C:
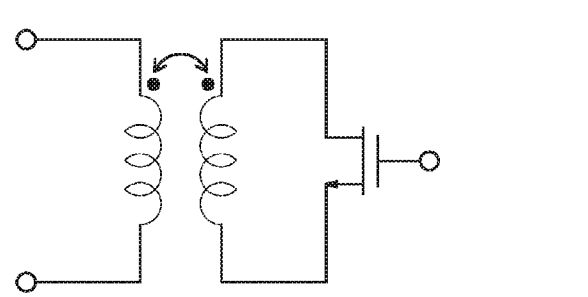

Referring to FIGS. 7A to 7C, schematic diagrams of different designs of the variable inductors I1 and I2 are shown. In various embodiments, the variable inductors I1 and I2 can adopt different designs. As indicated in FIG. 7A, the variable inductors I1 and I2 can respectively be realized by a switch-type inductor Ia. As indicated in FIG. 7B, the variable inductors I1 and I2 can respectively be realized by an MENS-type inductor Ib. As indicated in FIG. 70, the variable inductors I1 and I2 can respectively be realized by a transformer-type inductor Ic.

Refer to FIG. 4. The voltage-controlled oscillator 120 includes a calibration resonator U3 and a tunable negative impedance circuit 121. The transmitting resonator U1 (illustrated in FIG. 5) of the TX filter 111, the receiving resonator U2 (illustrated in FIG. 5) of the RX filter 112 and the calibration resonator U3 are disposed on the same piezo-electric substrate 190. Since the transmitting resonator U1, the receiving resonator U2 and the calibration resonator U3 have substantially the same size, the shape and the thickness, and are formed in the same manufacturing process, signal variation. The signal variation occurs to the transmitting resonator U1 and the receiving resonator U2 due to temperature factor or manufacturing process factor, may also occur to the calibration resonator U3. Thus, how to perform active calibration on the acoustic-wave duplexer 110 can be obtained through the analysis of the calibration resonator U3.

Figure 8:
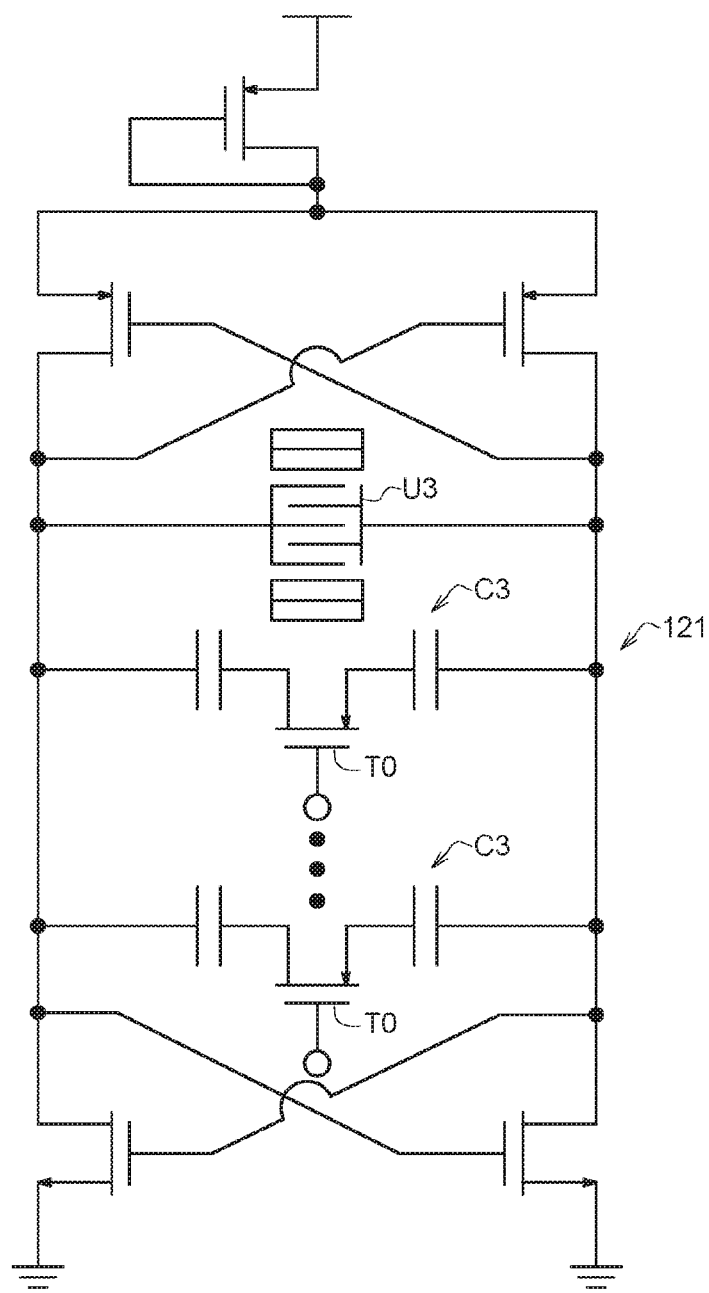
FIG. 8 shows a schematic diagram of the digitally adjusted voltage-controlled oscillator of FIG. 4.

Referring to FIG. 8, a schematic diagram of the digitally adjusted voltage-controlled oscillator 120 of FIG. 4 is shown. The voltage-controlled oscillator 120 includes the calibration resonator U3 and the tunable negative impedance circuit 121. The tunable negative impedance circuit 121 includes a plurality of binary capacitors C3 respectively connected to a transistor T0, such that the binary capacitors C3 can be digitally turned on or off.

Referring to FIG. 4, the frequency discriminator 130 digitally inputs an adjustment signal S11 to the tunable negative impedance circuit 121 to control the binary capacitors C3 to obtain a feedback signal S12. By continually adjusting the adjustment signal S11 and receiving the feedback signal S12, the frequency discriminator 130 can obtain a frequency deviation of the calibration resonator U3.

The frequency discriminator 130 generates a calibration signal S13 according to the frequency deviation of the calibration resonator U3.

The control circuit 140 is connected to the acoustic-wave duplexer 110 and the frequency discriminator 130. The control circuit 140 digitally adjusts the operating frequency of the TX filter 111 or the operating frequency of the RX filter 112 according to the calibration signal S13. As disclosed above, the control circuit 140 can adjust the operating frequency of the TX filter 111 or the operating frequency of the RX filter 112 using the variable capacitors C1 and C2 or the variable inductors I1 and I2.

As disclosed in above embodiments, the acoustic-wave device 100 with active calibration mechanism understands signal variation, which occurs to the transmitting resonator U1 and the receiving resonator U2 due to temperature factor or manufacturing process factor, using the calibration resonator U3, and accordingly performs active calibration.

Figure 9:
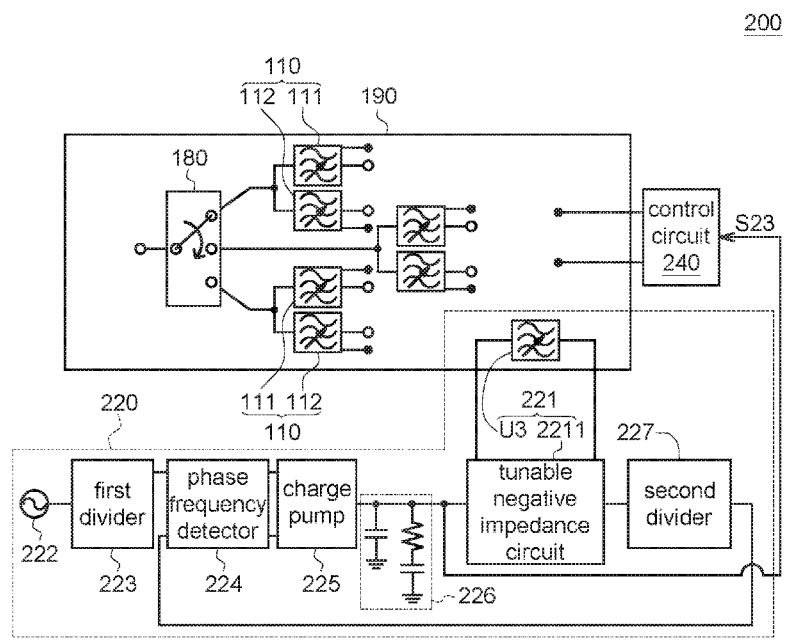
FIG. 9 shows a schematic diagram of an acoustic-wave device with active calibration mechanism according to another embodiment of the invention.

Referring to FIG. 9, a schematic diagram of an acoustic-wave device 200 with active calibration mechanism according to another embodiment of the invention is shown. In the present embodiment, the acoustic-wave device 200 includes at least one acoustic-wave duplexer 110, a phase-locked loop (PLL) 220 and a control circuit 240. Relevant descriptions of the acoustic-wave duplexer 110 are already disclosed in FIGS. 5 to 7C, and the similarities are not repeated here.

The phase-locked loop 220 includes a voltage-controlled oscillator 221, a clock signal source 222, a first divider 223, a phase frequency detector (PFD) 224, a charge pump 225, a second-order RC filter 226 and a second divider 227. The clock signal source 222 is used for providing a clock signal. The first divider 223 is connected to the clock signal source 222. The phase frequency detector 224 is connected to the first divider 223. The charge pump 225 is connected to the phase frequency detector 224. The second-order RC filter 226 is connected to the charge pump 225 and the voltage-controlled oscillator 221. The second divider 227 is connected to the voltage-controlled oscillator 221 and the phase frequency detector 224.

The phase-locked loop 220 employs a frequency and phase synchronization technique implemented using the feedback control principles for synchronizing a circuit output clock and an external reference clock. When the frequency or phase of the reference clock changes, the phase-locked loop 220 will detect the change and the feedback system of the phase-locked loop 220 will adjust the output frequency until the circuit output clock and the external reference clock are synchronized. Such synchronization is also referred as "phase-locked" synchronization.

Figure 10:
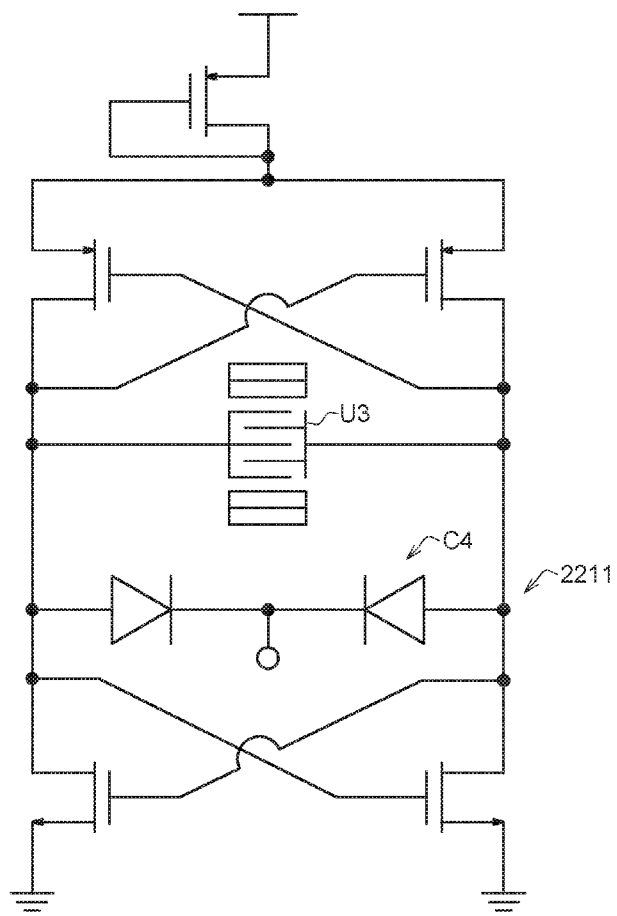
FIG. 10 shows a schematic diagram of the analogically adjusted voltage-controlled oscillator of FIG. 9.

In the present embodiment, the voltage-controlled oscillator 221 includes the calibration resonator U3 and a tunable negative impedance circuit 2211. Referring to FIG. 10, a schematic diagram of the analogically adjusted voltage-controlled oscillator 221 of FIG. 9 is shown. Relevant descriptions of the calibration resonator U3 are already disclosed above, and the similarities are not repeated here. The tunable negative impedance circuit 2211 includes a variable capacitor C4. The variable capacitor C4 can be analogically adjusted to achieve clock synchronization with the phase-locked loop 220.

Refer to FIG. 9. When the phase-locked loop 220 achieves clock synchronization, the phase-locked loop 220 can obtain the frequency deviation of the calibration resonator U3 and generate a calibration signal S23.

The control circuit 240 is connected to the acoustic-wave duplexer 110 and the phase-locked loop 220. The control circuit 240 analogically adjusts the operating frequency of the TX filter 111 or the operating frequency of the RX filter 112 according to the calibration signal S23. As disclosed above, the control circuit 240 can adjust the operating frequency of the TX filter 111 or the operating frequency of the RX filter 112 using the variable capacitors C1 and C2 or the variable inductors I1 and I2.

According to the above embodiments, the acoustic-wave device 200 with active calibration mechanism understands signal variation, which occurs to the transmitting resonator U1 and the receiving resonator U2 due to temperature factor or manufacturing process factor, using the calibration resonator U3, and accordingly performs active calibration.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An acoustic-wave device with active calibration mechanism, comprising:
   at least one acoustic-wave duplexer, comprising:
   a TX filter; and
   an RX filter;
   a voltage-controlled oscillator (VCO), comprising:
   a calibration resonator, wherein the TX filter, the RX filter and the calibration resonator are disposed on an identical piezoelectric substrate;
   a frequency discriminator, which generates a calibration signal according to a frequency deviation of the calibration resonator; and
   a control circuit connected to the acoustic-wave duplexer and the frequency discriminator, wherein the control circuit adjusts an operating frequency of the TX filter or an operating frequency of the RX filter according to the calibration signal.

2. The acoustic-wave device with active calibration mechanism according to claim 1, wherein the control circuit digitally adjusts the operating frequency of the TX filter or the operating frequency of the RX filter.

3. The acoustic-wave device with active calibration mechanism according to claim 1, wherein the TX filter comprises a plurality of transmitting resonators each having substantially the same size with the calibration resonator, and the RX filter comprises a plurality of receiving resonators each having substantially the same size with the calibration resonator.

4. The acoustic-wave device with active calibration mechanism according to claim 1, wherein the TX filter comprises a plurality of transmitting resonators each having substantially the same material with the calibration resonator, and the RX filter comprises a plurality of receiving resonators each having substantially the same material with the calibration resonator.

5. The acoustic-wave device with active calibration mechanism according to claim 1, wherein the TX filter comprises at least one variable capacitor and at least one variable inductor, and the control circuit controls the variable capacitor or the variable inductor to adjust the operating frequency of the TX filter.

6. The acoustic-wave device with active calibration mechanism according to claim 1, wherein the RX filter comprises at least one variable capacitor and at least one variable inductor, and the control circuit controls the variable capacitor or the variable inductor to adjust the operating frequency of the TX filter.

7. The acoustic-wave device with active calibration mechanism according to claim 1, wherein the voltage-controlled oscillator further comprises a tunable negative impedance circuit comprising a plurality of binary capacitors, and the frequency discriminator controls the binary capacitors to obtain the frequency deviation of the calibration resonator.

8. An acoustic-wave device with active calibration mechanism, comprising:
    at least one acoustic-wave duplexer, comprising:
    a TX filter; and
    an RX filter;
    a phase-locked loop (PLL), comprising:
    a voltage-controlled oscillator (VCO), comprising:
    a calibration resonator, wherein the TX filter, the RX filter and the calibration resonator are disposed on an identical piezoelectric substrate, and the phase-locked loop generates a calibration signal according to a frequency deviation of the calibration resonator; and
    a control circuit connected to the acoustic-wave duplexer and the phase-locked loop, wherein the control circuit adjusts the operating frequency of the TX filter or the operating frequency of the RX filter according to the calibration signal.

9. The acoustic-wave device with active calibration mechanism according to claim 8, wherein the control circuit digitally adjusts the operating frequency of the TX filter or the operating frequency of the RX filter.

10. The acoustic-wave device with active calibration mechanism according to claim 8, wherein the TX filter comprises a plurality of transmitting resonators each having substantially the same size with the calibration resonator, and the RX filter comprises a plurality of receiving resonators each having substantially the same size with the calibration resonator.

11. The acoustic-wave device with active calibration mechanism according to claim 8, wherein the TX filter comprises a plurality of transmitting resonators each having substantially the same material with the calibration resonator, and the RX filter comprises a plurality of receiving resonators each having substantially the same material with the calibration resonator.

12. The acoustic-wave device with active calibration mechanism according to claim 8, wherein the TX filter comprises at least one variable capacitor and at least one variable inductor, and the control circuit controls the variable capacitor or the variable inductor to adjust the operating frequency of the TX filter.

13. The acoustic-wave device with active calibration mechanism according to claim 8, wherein the RX filter comprises at least one variable capacitor and at least one variable inductor, and the control circuit controls the variable capacitor or the variable inductor to adjust the operating frequency of the TX filter.

14. The acoustic-wave device with active calibration mechanism according to claim 8, wherein the voltage-controlled oscillator further comprises a tunable negative impedance circuit comprising a variable capacitor, and the frequency discriminator controls the variable capacitor to obtain the frequency deviation of the calibration resonator.

15. The acoustic-wave device with active calibration mechanism according to claim 14, wherein the phase-locked loop further comprises:
    a clock signal source for providing a clock signal;
    a first divider connected to the clock signal source;
    a phase frequency detector (PFD) connected to the first divider;
    a charge pump connected to the phase frequency detector;
    a second-order RC filter connected to the charge pump and the voltage-controlled oscillator; and
    a second divider connected to the voltage-controlled oscillator and the phase frequency detector.

* * * * *